United States Patent [19]
Young

[11] Patent Number: 5,136,166
[45] Date of Patent: * Aug. 4, 1992

[54] TEMPERATURE STABLE MAGNETIC DEFLECTION ASSEMBLY

[75] Inventor: Lydia J. Young, Palo Alto, Calif.

[73] Assignee: ETEC Systems, Inc., Hayward, Calif.

[*] Notice: The portion of the term of this patent subsequent to Apr. 30, 2008 has been disclaimed.

[21] Appl. No.: 648,667

[22] Filed: Jan. 31, 1991

Related U.S. Application Data

[63] Continuation of Ser. No. 524,508, May 17, 1990, Pat. No. 5,012,104.

[51] Int. Cl.$^5$ .................. H01J 3/32; H01J 37/147; H01J 37/30
[52] U.S. Cl. .................. 250/396 ML; 250/492.2; 335/213; 335/210
[58] Field of Search .......... 250/396 ML, 396 R, 492.2; 335/213, 210

[56] References Cited

U.S. PATENT DOCUMENTS 5,012,104   4/1991   Young .................. 250/396 ML

FOREIGN PATENT DOCUMENTS

| 0051733 | 9/1981 | European Pat. Off. |
| 0244289 | 11/1987 | European Pat. Off. .... 250/396 ML |
| 57-19947 | 2/1982 | Japan . |
| 61-51737 | 3/1986 | Japan . |
| 61-227356 | 10/1986 | Japan . |
| 1-041155 | 2/1989 | Japan . |

*Primary Examiner*—Jack I. Berman
*Attorney, Agent, or Firm*—Skjerven, Morrill, MacPherson, Franklin & Friel

[57] ABSTRACT

A thermally stable magnetic deflection assembly for use in an electron or particle beam machine with several separately potted magnetic coils spaced apart and arranged in a particular vertical position on a central pipe. Non metallic, low coefficient of thermal expansion, highly thermally conductive materials are used throughout and means are provided for maintaining the entire assembly at a desired temperature. Also disclosed is a method of making a thermally stable magnetic deflection assembly.

10 Claims, 2 Drawing Sheets

TEMPERATURE STABLE MAGNETIC DEFLECTION ASSEMBLY

This application is a continuation of application Ser. No. 07/524,508, filed May 17, 1990, now U.S. Pat. No. 5,012,104.

BACKGROUND OF THE INVENTION

This invention relates to an improvement in the electron optics column of an electron beam lithography (EBL) system and is particularly directed to an improvement in the magnetic deflection assembly of the electron optics column of an EBL system and to a method of making such an assembly.

In an electron optics column of an EBL system, also referred to as an EBL machine, the magnetic deflection assembly includes several magnetic coils spaced apart and arranged in a particular angular orientation. Its role is to position the electron beam accurately (on the order of a few hundredths of a micrometer) within a field whose size is typically on the order of millimeters. The beam position is determined by applying an appropriate amount of current to the magnetic coils making up the magnetic deflection assembly. However, because the coil windings have a non-zero resistance, heat is dissipated in the coils and the assembly. If the heat is not removed, the resulting temperature changes in the materials making up the assembly can cause the materials to expand and shift in position, and therefore affect the magnetic fields of the energized coils and hence also beam placement. The accuracy of an EBL system requires the magnetic field distortions due to thermal effects to remain small over the time required to calibrate the machine and complete writing on a substrate (typically tens of minutes). Thus, not only must the temperature of the assembly remain staple ($<=1$ degree C) over time, but the thermal response time must also be short (no more than a few minutes).

It is therefore an object of this invention to provide a thermally stable magnetic deflection assembly for use in an EBL machine and to improve such machines by the incorporation of such an assembly in the beam column.

SUMMARY OF THE INVENTION

The magnetic deflection assembly of this invention includes several magnetic coils spaced apart and arranged in a particular angular orientation on a central pipe. Non-metallic, low coefficient of thermal expansion, highly thermally conductive materials are used throughout. The individual magnetic coils are separately potted, and the entire assembly is maintained at a desired temperature by a fluid coolant.

1. Except the coil windings themselves, the non-metallic materials minimize electromagnetic effects on the electron beam.

2. The low coefficient of thermal expansion materials ensure that the coil winding positions are minimally changed over the degree or so temperature rise.

3. The highly thermally conductive materials minimize distortion effects by assuring that the heat generated in the coil windings is uniformly, relatively quickly transferred and evenly distributed throughout the assembly.

4. The potting of the coils individually minimizes intercoil thermal expansion effects by ensuring efficient removal of heat from the coil windings and minimal physical contact between neighboring coils.

DETAILED DESCRIPTION OF THE PREFERRED EMBODIMENT

In this description, "magnetic deflection assembly" and "assembly" are used interchangeably and while this invention is disclosed as part of an EBL machine, the invention may be also used with a particle beam lithography machine.

Figure 1:
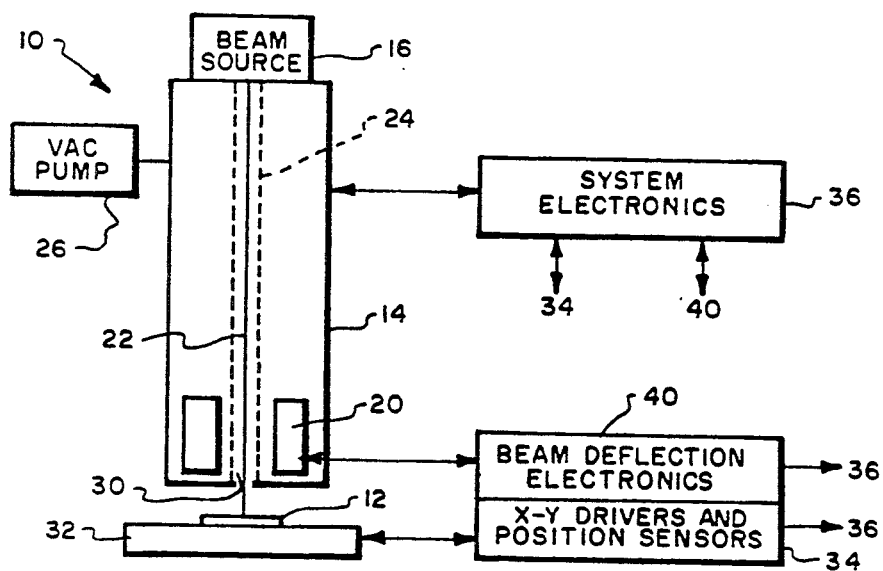
FIG. 1 is a schematic illustration of an EBL machine showing the location of the electron optical magnetic deflection assembly of this invention in the beam column.

FIG. 1 schematically illustrates an EBL machine 10 for processing a workpiece 12, also called a substrate, such as a semiconductor wafer or a mask. A beam column 14 including an electron source is, demagnification and projection optics (not shown) and a magnetic deflection assembly 20 which generate a finely focused beam 22 and may also include illumination and shaping optics when a shaped beam is utilized.

Magnetic deflection assembly 20 is shown in this figure for the purpose of showing its location in the beam column 14 and is the thermally stable assembly constructed in accordance with the teachings of this invention which will be explained in more detail in connection with FIGS. 2-5.

A central tube 24 (shown in phantom) is within the beam column 14 and is traversed by the beam and maintained at a high vacuum by a high vacuum pump 26 coupled to the beam column 14. The beam 22 passes through an opening 30 in the beam column 14 and impinges on the workpiece 12. The workpiece 12 is supported on a chuck (not shown) and is held in position on a movable stage 32 which is translated in the X and Y directions by and X-Y drive system and the position of the stage is sensed by position sensors, typically laser interferometers, all of which are represented by the block diagram 34. The X and Y axes define a horizontal plane. A complete EBL machine 10 further includes a computer (controller) and associated electronics which controls the beam, the X-Y drive system, the vacuum system, the substrate handling system and stores pattern data and provides beam control signals; all represented by block diagram 36. For the purpose of clarity, the beam deflection electronics shown separately as block diagram 40 and is shown connected to the assembly 20.

Figure 2:
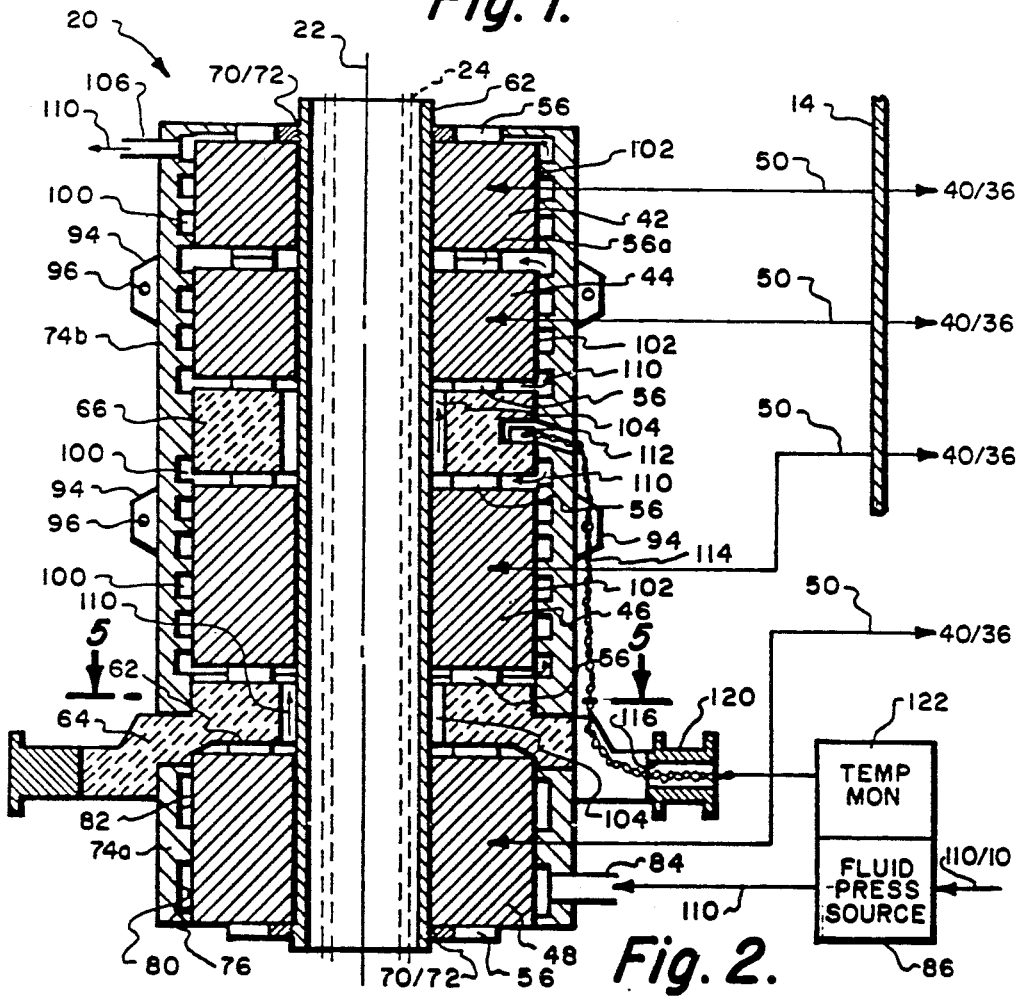
FIG. 2 is a cross-sectional view of the deflection assembly with a shroud surrounding the coils and enlarged over the showing of the assembly in FIG. 1 for clarity.

In the enlarged illustration is FIG. 2, it can be seen that the assembly 20 comprises a plurality of magnetic coils (four shown), 42-48, each shown coupled by separate conductors 50 to the beam deflection electronics 40 and the systems electronics 36. In practice, some coils are connected in series while others are connected separately to the beam deflection and systems electronics 36 and 40.

Figure 3:
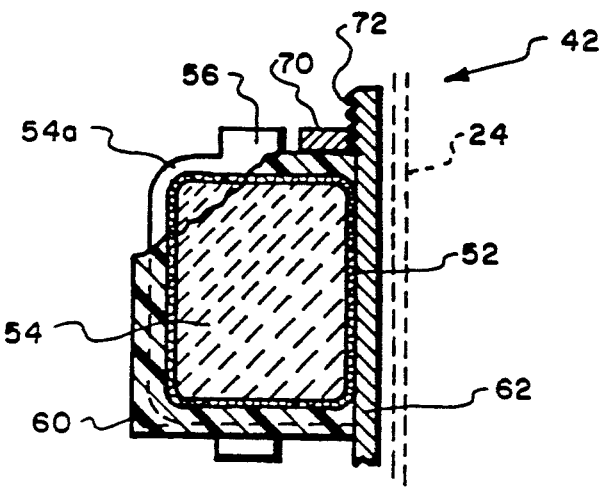
FIG. 3 is a cross-sectional view of one portion of a coil of the assembly to show the coil within the potting material in more detail.

In the fabrication of these coils and as shown in FIG. 3, wires 52 are wound on a toroidal coil form 54, represented by a round cornered rectangle, with the wires 52 shown within the confines of the coil form 54. These coil forms 54 each include a plurality of standoffs 56, in this case four, extending in opposite directions beyond the windings 52, to provide each coil with a means for defining the vertical position of the coils with respect to each other in vertical alignment as required by the optical design of the beam column 14. These coil forms 54 and standoffs 56 are of non-metallic, thermally stable material, such as ceramic.

After winding, each coil is separately vacuum potted in a non-metallic high thermally conductive potting material, leaving the standoffs exposed, so that the potting material encases the coil form and its winding as shown at 60 in FIG. 3. The potting material 60 is partially broken away in FIG. 3 to show how radial walls 54a of the coil form 54 are also encased in the potting material. The potted coils thus retain their cylindrical symmetry and to enhance conductive heat transfer, the outer surfaces of the potted coil are roughened.

The potted coils 42-48 are then stacked on a pipe 62 formed of a non-metallic, thermally stable material, such as ceramic, which, when positioned in a beam column, will surround the central tube 24. The inner dimension of the coils are set to provide a snug fit with the pipe 62. The coils are spaced from each other by the standoffs 56. These standoffs 56 also space three of the coils 44,46 and 48 from two relatively thick toroidal spacers 64 and 66 made of non-metallic, thermally stable material, preferably ceramic. Spacer 64 is referred to as a lens spacer and spacer 66 is referred to as an align spacer and are used wherever the alignment and space between the coils are critical in the beam column. All of the coils 42-48 and spacers 64 and 66 are positioned on the central pipe 62, oriented and spaced as desired, and held together by a pair of non-metallic end caps 70 threadably engaging thread 72 on each end of the central pipe 62. FIG. 3 shows the top end of the pipe 62 and one end cap 70, enlarged for clarity as stated before.

A three piece shroud of non metallic material surrounds the coils to provide a flow path for coolant. The shroud comprises a lower cup-like piece 74a and two substantially identical clam shell pieces (only one shown as 74b).

The lower shroud piece 74a, surrounding the lowest coil 48, contains two separate cavities which, together with the outside wall 76 of the coil 48, form peripheral fluid passages 80 and 82. This lower shroud piece 74a has an entrance passage 84 connecting the passage 80 to a fluid pressure source 86 (gas or liquid) for the flow of coolant through the deflection stack 20. The flow path of the coolant is shown in the partial view of the shroud piece 74a in FIG. 4 where the two passages 80 and 82 are interconnected by a passage 90 and where passage 92 allows the coolant to leave the upper passages 82.

It should be apparent that, depending upon the physical constraints on the assembly, the two cavities in the lower shroud piece which define passages 80 and 82 with connecting passage 90 may be replaced with helical peripheral grooves such as those in the upper shroud and connected for the flow of coolant by the flow passages 80 and 92.

Figures 4, 5:
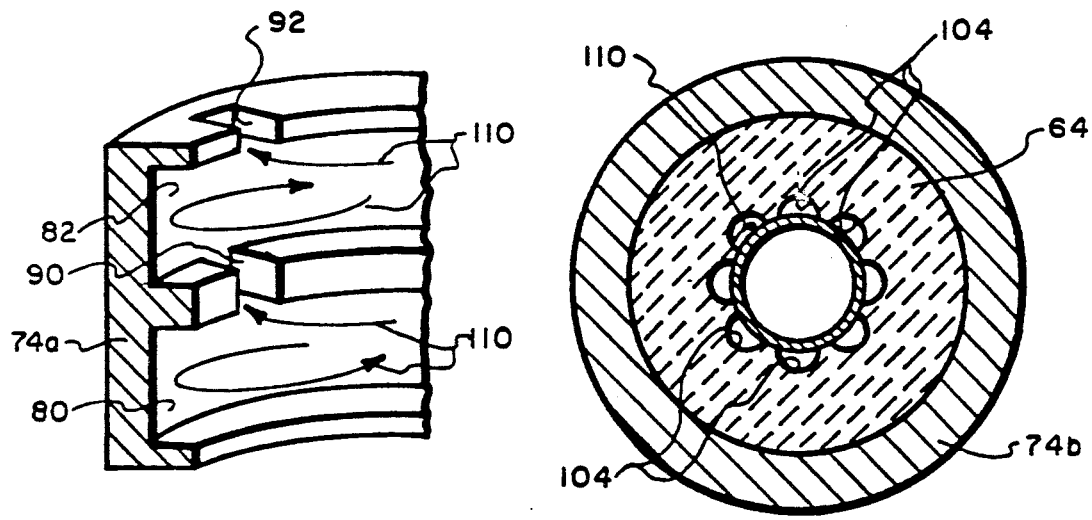
FIG. 4 is a perspective view partially showing the lower piece of the shroud and the coolant flow in that part of the shroud.
FIG. 5 is a cross-sectional view of a spacer in the assembly, taken along line 5—5 of FIG. 2 showing the flow path of coolant through the spacer.

The two upper shroud pieces are held together by suitable screws in radially outwardly extending ribs 94 in threaded holes 96 thereof. These upper shroud pieces, surrounding the other three coils 42, 44 and 46, contain helical grooves 100 on the inner wall of the pieces and form, together with the outer walls 102 of the three coils, continuous helical perpheral passages for the flow of the coolant. FIG. 5 shows that the lower spacer 64 contains semicircular openings 104 adjacent the central pipe 62 for the flow of coolant through the spacer from the lower shroud 74a. Similar semicircular openings 104 are provided in the upper spacer 66 also for the flow of coolant therethrough.

Thus, as can be seen, fluid coolant from the fluid pressure source 86 flows through the passages 80 and 82 in the lower shroud 74a and through the passages 90 and 92 and out along the bottom of the spacer 64 through a space provided by standoffs 56, through holes 104 and then along the top of the spacer 64, through a space provided by the standoff 56 and into the helical groove 100. The coolant exits the helical groove 100 in a space provided by standoffs 56 between the coil 46 and the upper spacer 66, through the holes 104 in the upper spacer 66 and then along the top of the spacer 66 in the space provided by the standoffs 56 where the coolant again enters the helical passages 100 where the coolant finally exits through the opening 106 at the top of the upper shroud 74b. Arrows 110 show the flow path through the assembly 20. The coolant is also able to flow between the larger of the spaces formed by the standoff 56 between the coils 42 and 44.

The fluid pressure source may be a pump for directing ambient air or a gas as a coolant or a liquid pump for liquid coolants. The temperature of the non ambient air can be controlled with a feedback loop between the assembly 20 and the fluid pressure source. It has been found that ambient air cools the assembly satisfactorily.

The coolant maintains the assembly 20 at a desired temperature which is monitored by a sensor 112, shown in the upper spacer 66, and connected by wires 114 extending through a gap 116 in a radial extension 120 of the lower spacer 64 to a temperature monitor 122. The placement of the sensor 112 in the upper spacer 66 is not critical since the sensor can be placed in any location in the assembly 20 where a representative temperature of the assembly can be determined. The flow of the coolant could be reversed from the shown by having the coolant entering the top of the assembly. Other variations of the coolant paths are possible; the only criteria is that the assembly is maintained at the desired temperature.

Also, while the conductors 50 are shown exiting the beam column 14, apart from the extension 120, the preferred placement of the conductors 50 is through the gap 116 of the extension 120 and out to the electronics 40/36. The showing in FIG. 1 is to simplify the disclosure herein.

In the foregoing, "low" coefficient of thermal expansion means $<10^{-6}$ cm/cm °C. and "high" thermal conductivity means $\geq 10^{-2}$ W/cm °C. for the potting material and $>10^{-1}$ W/cm °C. for the ceramic material.

The foregoing materials are quite capable of dissipating the heat generated by about 3 watts (average) and about 6 watts for maximum field beam deflection (though seldom generated) in the operation of the assembly.

I claim:

1. For a beam column of a lithography machine, a thermally stable magnetic deflection assembly comprising:

a plurality of magnetic coils each formed of conductors; and means for spacing apart and arranging the coils, said means being formed of non-metallic thermally stable material.

2. The assembly as claimed in claim 1, wherein said means for spacing apart comprises:

a plurality of coil forms, each of said plurality of coils being wound on one of said plurality of coil forms;

a pipe, said coils being stacked on said pipe;

means for vertically spacing each coil from each other; and thermally conductive material coating each coil.

3. The assembly as claimed in claim 1, wherein each of said coils is individually cooled so as to be thermally independent of one another.

4. The assembly as claimed in claim 2, wherein said means for vertically spacing comprises a standoff formed integrally with one of said coil forms and extending beyond the coated coils.

5. The assembly as claimed in claim 3, wherein said means for vertically spacing comprises spacers of non-metallic thermally stable material.

6. The assembly as claimed in claim 1, wherein each of said coils are stacked on said pipe in a snug-fit relationship.

7. The assembly as claimed in claim 1, further comprising a shroud of non-metallic material surrounding said coils, said shroud defining a passage for circulating fluid coolant.

8. The assembly as claimed in claim 7, wherein said shroud comprises a plurality of shroud pieces of non-metallic material and surrounding some of said coils, and a cup-like shroud piece of non-metallic material and surrounding the remainder of said coils.

9. The assembly as claimed in claim 8, wherein said shroud pieces are separated by spacers of non-metallic thermally stable material.

10. For a beam column of a lithography machine, a thermally stable magnetic deflection assembly comprising:

a plurality of magnetic coils each wound on a form of non-metallic thermally stable material;

each coil being surrounded by thermally conductive material;

a pipe of non-metallic thermally stable material;

said coils being stacked on said pipe; and means for vertically spacing each coil from each other.

* * * * *